United States Patent
Iwasaki et al.

(10) Patent No.: US 10,276,798 B2
(45) Date of Patent: Apr. 30, 2019

(54) PRODUCTION METHOD OF ORGANIC EL DEVICE

(71) Applicant: SUMITOMO CHEMICAL COMPANY, LIMITED, Tokyo (JP)

(72) Inventors: Masataka Iwasaki, Niihama (JP); Takaaki Okamoto, Niihama (JP)

(73) Assignee: SUMITOMO CHEMICAL COMPANY, LIMITED, Chuo-ku, Tokyo (JP)

(*) Notice: Subject to any disclaimer, the term of this patent is extended or adjusted under 35 U.S.C. 154(b) by 0 days.

(21) Appl. No.: 15/568,954

(22) PCT Filed: Jun. 9, 2016

(86) PCT No.: PCT/JP2016/067175
§ 371 (c)(1),
(2) Date: Oct. 24, 2017

(87) PCT Pub. No.: WO2016/204057
PCT Pub. Date: Dec. 22, 2016

(65) Prior Publication Data
US 2018/0123045 A1 May 3, 2018

(30) Foreign Application Priority Data

Jun. 15, 2015 (JP) ................................ 2015-120026

(51) Int. Cl.
*H01L 21/00* (2006.01)
*H01L 51/00* (2006.01)
(Continued)

(52) U.S. Cl.
CPC ...... *H01L 51/0029* (2013.01); *H01L 51/0003* (2013.01); *H01L 51/0007* (2013.01);
(Continued)

(58) Field of Classification Search
CPC ............. H01L 51/0029; H01L 51/0007; H01L 51/5253; H01L 51/5012
See application file for complete search history.

(56) References Cited

U.S. PATENT DOCUMENTS 7,317,280 B2 * 1/2008 Qiu ...................... H01L 51/5256
313/503
8,680,516 B2 * 3/2014 Jan ...................... H01L 51/5253
257/40
(Continued)

FOREIGN PATENT DOCUMENTS

JP 2007-265880 A 10/2007
JP 2010-129201 A 6/2010
(Continued)

OTHER PUBLICATIONS

Notification of Reasons for Rejection dated Sep. 6, 2016 in corresponding JP 2016-540049.
(Continued)

*Primary Examiner* — Laura M Menz
(74) *Attorney, Agent, or Firm* — Sughrue Mion, PLLC

(57) ABSTRACT

A method for producing an organic EL device having an anode, a cathode, at least one organic functional layer disposed between the anode and the cathode, and a sealing layer, comprising
a step of forming the anode, a step of forming the cathode, a step of forming the at least one organic functional layer and a step of forming the sealing layer,
wherein the average concentration: A (ppm) of a nitrogen oxide to which the organic EL device during production is exposed from initiation time of the step of forming the at least one organic functional layer until termination time of the step of forming the sealing layer and the exposure time thereof: B (sec) satisfy the formula (1-1):

$$0 \leq A \times B < 12 \qquad (1\text{-}1).$$

10 Claims, 1 Drawing Sheet

(51) Int. Cl.
    *H01L 51/50*     (2006.01)
    *H05B 33/04*     (2006.01)
    *H05B 33/10*     (2006.01)
    *H01L 51/52*     (2006.01)

(52) U.S. Cl.
    CPC .......... *H01L 51/50* (2013.01); *H01L 51/5253* (2013.01); *H05B 33/04* (2013.01); *H05B 33/10* (2013.01); *H01L 51/5012* (2013.01)

(56) References Cited

U.S. PATENT DOCUMENTS

| | | | |
|---|---|---|---|
| 8,703,529 B2 * | 4/2014 | Chen | H01L 51/0007 257/E51.022 |
| 8,927,326 B2 * | 1/2015 | Nakatsuka | H01L 51/0029 257/40 |
| 9,065,064 B2 * | 6/2015 | Tomita | H01L 51/0017 |
| 9,673,395 B2 * | 6/2017 | Lee | H01L 51/0003 |
| 2013/0240844 A1 * | 9/2013 | Nakatsuka | H01L 51/0029 257/40 |
| 2015/0041789 A1 * | 2/2015 | Ozeki | C07D 471/04 257/40 |
| 2015/0311467 A1 * | 10/2015 | Hakii | C07D 405/14 257/40 |
| 2016/0056412 A1 * | 2/2016 | Hirosawa | H01L 51/5253 257/40 |
| 2018/0102508 A1 * | 4/2018 | Iwasaki | H01L 51/50 |
| 2018/0123045 A1 * | 5/2018 | Iwasaki | H01L 51/50 |
| 2018/0123072 A1 * | 5/2018 | Iwasaki | H01L 51/50 |

FOREIGN PATENT DOCUMENTS

| | | | | |
|---|---|---|---|---|
| JP | WO 2011115075 A1 * | 9/2011 | ......... | H01L 51/0029 |
| JP | 5423706 B2 | 2/2014 | | |
| JP | 2016-029635 A | 3/2016 | | |
| WO | WO-2011115075 A1 * | 9/2011 | ......... | H01L 51/0029 |

OTHER PUBLICATIONS

International Search Report of PCT/JP2016/067175 dated Sep. 6, 2016.
Extended European Search Report dated Jun. 5, 2018 in European Patent Application No. 16811532.7.
Communication dated Oct. 23, 2018, from State Intellectual Property Office of the P.R.C. in counterpart application No. 201680033109. 2.

* cited by examiner

[Fig. 1]
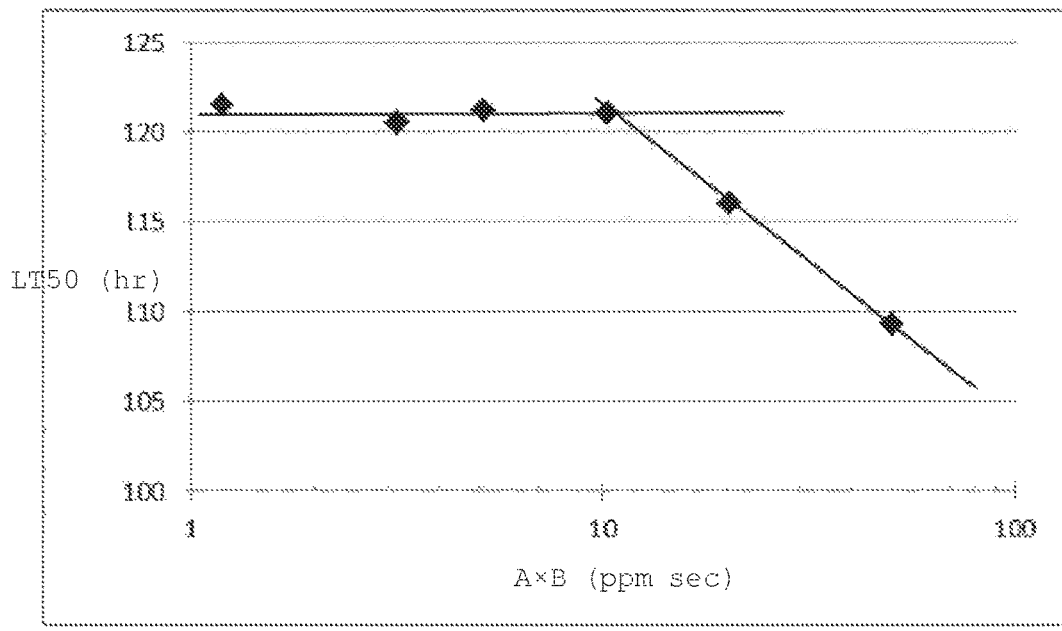
[Fig. 2]
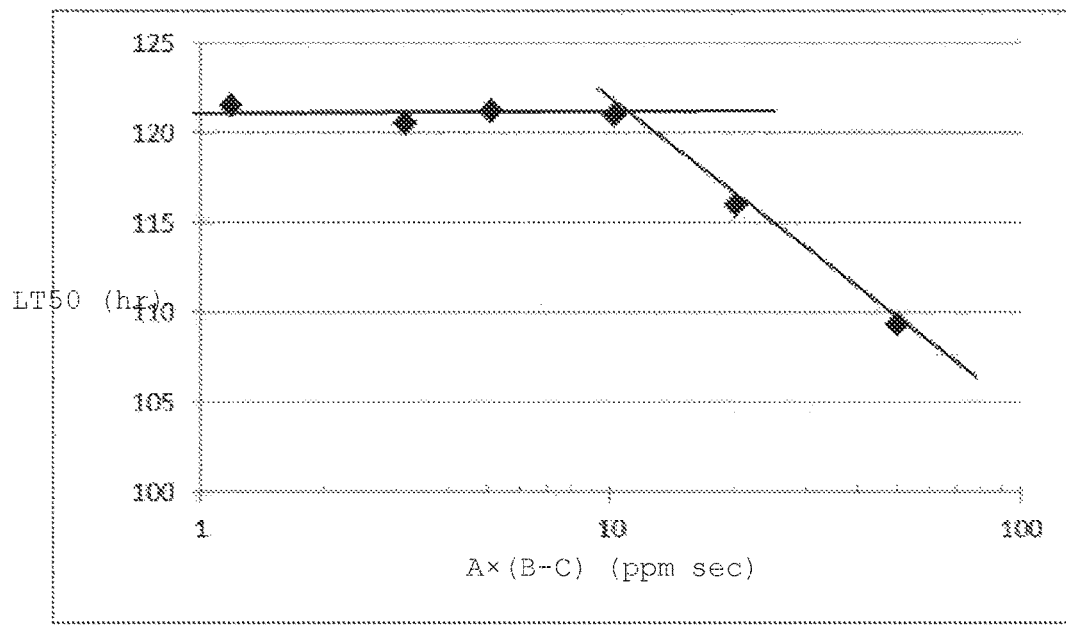

PRODUCTION METHOD OF ORGANIC EL DEVICE

CROSS REFERENCE TO RELATED APPLICATIONS

This application is a National Stage of International Application No. PCT/JP2016/067175 filed Jun. 9, 2016, claiming priority based on Japanese Patent Application No. 2015-120026 filed Jun. 15, 2015, the contents of all of which are incorporated herein by reference in their entirety.

TECHNICAL FIELD

The present invention relates to a production method of an organic EL device.

BACKGROUND ART

An organic electroluminescent device (hereinafter, referred to as "organic EL device") can be suitably used for applications such as display and illumination because of high light emission efficiency and low driving voltage. The organic EL device contains an anode, a cathode, and a light emitting layer disposed between the anode and the cathode, wherein holes and electrons injected from the anode and the cathode respectively combine in the light emitting layer to cause light emission.

The organic EL device has a merit that an organic layer such as a light emitting layer and the like can be formed by an application method by which the production method is easy and enlargement of the area of the device is easy. Regarding environments in forming an organic layer of an organic EL device, a production method of an organic EL device in which formation of the organic layer is conducted at a sulfur oxide concentration of 2.2 µg/m³ or less, a nitrogen oxide concentration of 3.1 µg/m³ or less and a carbon dioxide concentration of 0.7 µg/m³ or less is suggested (Patent document 1).

PRIOR ART DOCUMENT

Patent Document

Patent document 1: Japanese Patent No. 5423706

SUMMARY OF THE INVENTION

Problem to be Solved by the Invention

The organic EL device produced by the above-described production method, however, is not necessarily sufficient in luminance life.

Then, the present invention has an object of providing a production method of an organic EL device excellent in light emission life.

Means for Solving the Problem

The present invention provides the following [1] to [10],
[1] A method for producing an organic EL device having
an anode, a cathode, at least one organic functional layer disposed between the anode and the cathode, and a sealing layer, comprising
a step of forming the anode, a step of forming the cathode, a step of forming the at least one organic functional layer and a step of forming the sealing layer,
wherein the average concentration: A (ppm) of a nitrogen oxide to which the organic EL device during production is exposed from initiation time of the step of forming the at least one organic functional layer until termination time of the step of forming the sealing layer and the exposure time thereof: B (sec) satisfy the formula (1-1):

$$0 \leq A \times B < 12 \quad (1\text{-}1).$$

[2] The method for producing an organic EL device according to [1], wherein the step of forming the at least one organic functional layer contains a film formation stage, a drying stage and a calcination stage, and the time necessary for the film format ion stage: C (sec) satisfies the formula (2-1):

$$0 \leq A \times (B-C) < 12 \quad (2\text{-}1)$$

[3] The method for producing an organic EL device according to [1] or [2], wherein A satisfies the formula (3-1):

$$0 \leq A < 1 \quad (3\text{-}1).$$

[4] The method for producing an organic EL device according to any one of [1] to [3], wherein B satisfies the formula (4-1):

$$0 \leq B \leq 86400 \quad (4\text{-}1).$$

[5] The method for producing an organic EL device according to any one of [2] to [4], wherein C satisfies the formula (5-1):

$$0 \leq C \leq 3000 \quad (5\text{-}1).$$

[6] The method for producing an organic EL device according to any one of [1] to [5], wherein the average concentration: D (ppm) of a nitrogen oxide, the average concentration: E (ppm) of a sulfur oxide and the average concentration: F (ppm) of ammonia, to which the organic EL device during production is exposed from initiation time of the step of forming the at least one organic functional layer until termination time of the step of forming the sealing layer, and the exposure time thereof: G (sec), satisfy at least two of the formulae (6-1) to (6-3):

$$0 \leq D \times G < 12 \quad (6\text{-}1)$$

$$0 \leq E \times G < 2.2 \quad (6\text{-}2)$$

$$0 \leq F \times G < 105 \quad (6\text{-}3).$$

[7] The method for producing an organic EL device according to [6], wherein D, E and F satisfy at least two of the formulae (9-1) to (9-3):

$$0 \leq D < 1 \quad (9\text{-}1)$$

$$0 \leq E < 0.3 \quad (9\text{-}2)$$

$$0 \leq F < 1 \quad (9\text{-}3).$$

[8] The production method of an organic EL device according to [6] or [7], wherein G satisfies the formula (12-1):

$$0 \leq G \leq 86400 \quad (12\text{-}1).$$

[9] The production method of an organic EL device according to any one of [1] to [8], wherein the step of forming the at least one organic functional layer contains a step of film formation by an application method using a composition containing an organic functional material and an organic solvent.

[10] The production method of an organic EL device according to any one of [1] to [9], wherein the at least one organic functional layer contains a polymer compound.

Effect of the Invention

According to the present invention, a production method of an organic EL device excellent in light emission life can be provided,

BRIEF EXPLANATION OF DRAWING

FIG. 1 is a view showing a relation between the product: A×B of the average concentration: A (ppm) of a nitrogen oxide to which the organic EL device during production is exposed and the exposure time thereof: B (sec), and the luminance half life (hr).

FIG. 2 is a view showing a relation between the product: A×(B−C) of the average concentration: A (ppm) of a nitrogen oxide to which the organic EL device during production is exposed and the time (B−C) obtained by reducing the time: C (sec) necessary for a film formation stage of at least one organic functional layer from the exposure time thereof: B (sec), and the luminance half life (hr).

MODES FOR CARRYING OUT THE INVENTION

Preferable embodiments of the present invention will be illustrated below.

Explanation of Common Terms

Terms commonly used in the present specification have means shown below unless otherwise stated.

"Polymer compound" denotes a polymer having molecular weight distribution and having a polystyrene-equivalent number-average molecular weight of $1 \times 10^3$ to $1 \times 10^8$.

The polymer compound may be any of a block copolymer, a random copolymer, an alternate copolymer and a graft copolymer, and may also be a copolymer of the other form.

"Low molecular weight compound" denotes a compound not having molecular weight distribution and having a molecular weight of $1 \times 10^4$ or less.

"Crosslink group" is a group capable of generating a new bond by subjecting to a heating treatment (calcination), an ultraviolet irradiation treatment, a radical reaction and the like, and is preferably a group represented by any of the formulae (B-1) to (B-17). The foregoing groups optionally have a substituent.

[Chemical Formula 1]

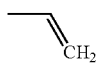

(B-1)

(B-2)

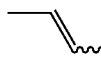

(B-3)

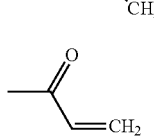

(B-4)

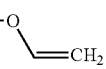

(B-5)

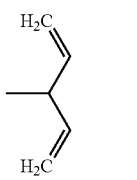

(B-6)

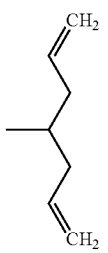

(B-7)

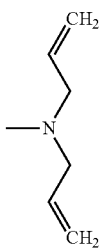

(B-8)

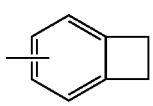

(B-9)

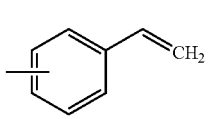

(B-10)

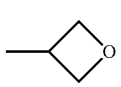

(B-11)

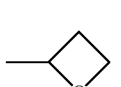

(B-12)

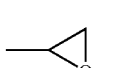

(B-13)

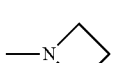

(B-14)

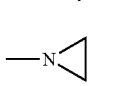

(B-15)

—N₃ (B-16)

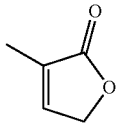

(B-17)

"the organic EL device during production is exposed" means that the device is exposed to a gas present outside the organic EL device.

"initiation time of the step of forming the at least one organic functional layer" denotes initiation time of a step of forming the first organic functional layer.

"ppm" is by volume.

<Production Method of Organic EL Device>

The production method of the present invention is a production method of an organic EL device having an anode, a cathode, at least one organic functional layer disposed between the anode and the cathode, and a sealing layer, comprising a step of forming the anode, a step of forming the cathode, a step of forming the at least one organic functional layer and a step of forming the sealing layer, wherein the average concentration: A (ppm) of a nitrogen oxide to which the organic EL device during production is exposed from initiation time of the step of forming the at least one organic functional layer until termination time of the step of forming the sealing layer and the exposure time thereof: B (sec) satisfy the above-described formula (1-1).

When the organic EL device has several organic functional layers, the product A×B of the average concentration A of a nitrogen oxide and the exposure time thereof B can be calculated also from the sum of the products of the average concentration: a (ppm) of a nitrogen oxide to which the organic EL device during production is exposed in the step of forming each organic functional layer and the exposure time thereof: b (sec).

A×B preferably satisfies the formula (1-2), more preferably satisfies the formula (1-3), further preferably satisfies the formula (1-4), since excellent device life can be kept.

$$0 \leq A \times B < 10 \quad (1\text{-}2)$$

$$0 \leq A \times B < 5 \quad (1\text{-}3)$$

$$1 \leq A \times B < 5 \quad (1\text{-}4)$$

The step of forming at least one organic functional layer usually contains a film formation stage, a drying stage, a holding stage, a calcination stage and a cooling stage. Of them, a drying stage, a holding stage, a calcination stage and a cooling stage can be omitted where they are not necessary.

The film formation stage is a stage of forming a film with an organic functional material or a composition containing an organic functional material and an organic solvent using a vacuum vapor deposition method or an application method.

The drying stage is a stage of removing an organic solvent if necessary, when the film formation stage is conducted by an application method. It is preferable that the drying stage is carried out in vacuum for flattening the film shape.

The holding stage is a stage in which the organic EL device during production is kept until switching to the next stage. It is preferable that the holding stage is short.

The calcination stage is a stage for crosslinking a crosslink group when the organic functional material has the crosslink group, or a stage for removing an organic solvent remaining in the drying stage or water in the organic functional layer. It is preferable that the calcination stage is conducted under an inert gas atmosphere for preventing oxidation of the organic functional material.

The cooling stage is a stage for returning the temperature of the organic EL device during production which has been calcined to room temperature. It is preferable that the cooling stage is conducted under a dried environment having a water content of 1 ppm or less for preventing adsorption of water.

Further, it is preferable that the step of forming at least one organic functional layer contains a film formation stage, a drying stage and a calcination stage, wherein the time: C (sec) required for the film formation stage satisfies the above-described formula (2-1), in the production method of the present invention, since excellent device life can be kept.

When the organic EL device has several organic functional layer, the product A×(B−C) of the average concentration A of a nitrogen oxide and the exposure time thereof B−C can be calculated also from the sum of the products of the average concentration: a (ppm) of a nitrogen oxide to which the organic EL device during production is exposed in the step of forming each organic functional layer and the exposure time thereof b−c (sec).

A×(B−C) more preferably satisfies the formula (2-2), further preferably satisfies the formula (2-3), particularly preferably satisfies the formula (2-4).

$$0 \leq A \times (B-C) < 10 \quad (2\text{-}2)$$

$$0 \leq A \times (B-C) < 5 \quad (2\text{-}3)$$

$$1 \leq A \times (B-C) < 5 \quad (2\text{-}4)$$

A preferably satisfies the above-described formula (3-1), more preferably satisfies the formula (3-2), further preferably satisfies the formula (3-3), since excellent device life can be kept.

$$0 \leq A < 0.1 \quad (3\text{-}2)$$

$$0 \leq A < 0.01 \quad (3\text{-}3)$$

B preferably satisfies the above-described formula (4-1), more preferably satisfies the formula (4-2), further preferably satisfies the formula (4-3), since excellent device life can be kept.

$$0 \leq B < 43200 \quad (4\text{-}2)$$

$$0 \leq B < 18000 \quad (4\text{-}3)$$

C preferably satisfies the above-described formula (5-1), more preferably satisfies the formula (5-2), further preferably satisfies the formula (5-3), since excellent device life can be kept.

$$0 \leq C < 1500 \quad (5\text{-}2)$$

$$0 \leq C < 600 \quad (5\text{-}3)$$

In the production method of the present invention, it is preferable to take account of also the average concentration of a sulfur oxide and the exposure time thereof and the average concentration of ammonia and the exposure time thereof in addition to the average concentration of a nitrogen oxide and the exposure time thereof since excellent device life can be kept. That is, it is preferable that the average concentration: D (ppm) of a nitrogen oxide, the average concentration: E (ppm) of a sulfur oxide and the average concentration: F (ppm) of ammonia, to which the organic EL device during production is exposed from initiation time of the step of forming the at least one organic functional layer until termination time of the step of forming the sealing layer, and the exposure time thereof: G (sec), satisfy at least two of the above-described formulae (6-1) to (6-3), in the production method of the present invention.

When the organic EL device has several organic functional layers, the products D×G, E×G and F×G of the average concentration D of a nitrogen oxide, the average concentration E of a sulfur oxide and the average concentration F of ammonia and the exposure time thereof G can be calculated also from the sum of the products of the average concentration: d (ppm) of a nitrogen oxide, the average concentration e of a sulfur oxide and the average concentration f of ammonia, to which the organic EL device during production is exposed in the step of forming each organic functional layer, and the exposure time thereof: g (sec).

D, E, F and G more preferably satisfy at least two of the formulae (7-1) to (7-3), further preferably satisfy at least two of the formulae (8-1) to (8-3), particularly preferably satisfy at least two of the formulae (8-4) to (8-6), since excellent device life can be kept.

$$0 \leq D \times G < 10 \qquad (7\text{-}1)$$

$$0 \leq E \times G < 1 \qquad (7\text{-}2)$$

$$0 \leq F \times G < 25 \qquad (7\text{-}3)$$

$$0 \leq D \times G < 5 \qquad (8\text{-}1)$$

$$0 \leq E \times G < 0.5 \qquad (8\text{-}2)$$

$$0 \leq F \times G < 10 \qquad (8\text{-}3)$$

$$1 \leq D \times G < 5 \qquad (8\text{-}4)$$

$$0.15 \leq E \times G < 0.5 \qquad (8\text{-}5)$$

$$1 \leq F \times G < 10 \qquad (8\text{-}6)$$

D, E, F and G preferably satisfy at least two of the above-described formulae (9-1) to (9-3), more preferably satisfy at least two of the formulae (10-1) to (10-3), further preferably satisfy at least two of the formulae (11-1) to (11-3), since excellent device life can be kept.

$$0 \leq D < 0.1 \qquad (10\text{-}1)$$

$$0 \leq E < 0.03 \qquad (10\text{-}2)$$

$$0 \leq F < 0.1 \qquad (10\text{-}3)$$

$$0 \leq D < 0.01 \qquad (11\text{-}2)$$

$$0 \leq E < 0.003 \qquad (11\text{-}2)$$

$$0 \leq F < 0.01 \qquad (11\text{-}3)$$

G preferably satisfies the above-described formula (12-1), more preferably satisfies the formula (12-2), further preferably satisfies the formula (12-3), since excellent device life can be kept.

$$0 \leq G < 43200 \qquad (12\text{-}2)$$

$$0 \leq G < 18000 \qquad (12\text{-}3)$$

In the production method of the present invention, a process from initiation time of the step of forming at least one organic functional layer until termination time of the step of forming a sealing layer is carried out under an environment having a low average concentration of a nitrogen oxide, preferably under an environment having low average concentrations of a nitrogen oxide, a sulfur oxide and ammonia, Such an environment may be prepared by any method, and it is preferable that a process from initiation time of the step of forming at least one organic functional layer until termination time of the step of forming a sealing layer is carried out under an environment in a room having a removing filter disposed at an external air intake.

The removing filter includes, for example, chemical filters such as a chemical filter using activated carbon, a chemical filter using a catalyst, and the like, and a chemical filter using activated carbon is preferable since the average concentrations of a nitrogen oxide, a sulfur oxide and ammonia can be reduced more.

The average concentrations of a nitrogen oxide, a sulfur oxide and ammonia can be measured, for example, using a detecting tube manufactured by GASTEC Corporation.

<Layer Constitution of Organic EL Device>

The organic EL device produced by the production method of the present invention has an anode, a cathode, at least one organic functional layer and a sealing layer.

The organic functional layer is a layer containing a material capable of injecting and transporting holes or electrons, thereby emitting light, by passing an electric current through an anode and a cathode or by applying voltage. The material used in the organic functional layer may be a material capable of injecting and transporting holes or electrons, thereby emitting light, by passing an electric current or by applying voltage, and an organic functional material is preferable.

As the organic functional material, known materials can be used, and examples thereof include distyrylbiphenyl type materials, dimesitylboryl type materials, stilbene type materials, dipyrilyldicyanobenzene type materials, benzoxazole type materials, distyryl type materials, carbazole type materials, dibenzochrysene type materials, arylamine type materials, pyrene-substituted oligothiophene type materials, PPV oligomer type materials, carbazole type materials and polyfluorene type materials.

It is preferable that the organic functional layer is formed by an application method using a composition containing an organic functional material and an organic solvent. The application method includes, for example, a spin coat method, a casting method, a micro gravure coat method, a gravure coat method, a bar coat method, a roll coat method, a wire bar coat method, a dip coat method, a spray coat method, a screen printing method, a flexo printing method, an offset printing method, an Inkjet printing method, a capillary coat method and a nozzle coat method, and preferable are a spin coat method, a nozzle coat method and an Inkjet printing method.

The viscosity of the composition may be controlled by the kind of an application method, and in the case of applying to a printing method in which an ink goes through a discharge apparatus such as an Inkjet printing method and the like, the viscosity is preferably 1 to 20 mPa·s at 25° C. for preventing curved flying and clogging in discharging.

The organic solvent contained in the composition is preferably a solvent capable of dissolving or uniformly dispersing solid components in the composition. The organic solvent includes, for example, chlorine-based solvents such as 1,2-dichloroethane, 1,1,2-trichloroethane, chlorobenzene, o-dichlorobenzene and the like; ether solvents such as tetrahydrofuran, dioxane, anisole, 4-methylanisole and the like; aromatic hydrocarbon solvents such as toluene, xylene, mesitylene, ethylbenzene, n-hexylbenzene, cyclohexylbenzene and the like; aliphatic hydrocarbon solvents such as cyclohexane, methylcyclohexane, n-pentane, n-hexane, n-heptane, n-octane, n-nonane, n-decane, n-dodecane, bicyclonexyl and the like; ketone solvents such as acetone, methyl ethyl ketone, cyclohexanone, acetophenone and the like; ester solvents such as ethyl acetate, butyl acetate, ethylcellosolve acetate, methyl benzoate, phenyl acetate and the like; polyhydric alcohol solvents such as ethylene glycol, glycerin, 1,2-hexanediol and the like; alcohol solvents such as isopropyl alcohol, cyclohexanol and the like; sulfoxide solvents such as dimethyl sulfoxide and the like; and amide solvents such as N,N-dimethylformamide and the like. One kind of the solvent may be used singly or two or more kinds of the solvents may be used in combination.

The organic functional layer includes, for example, a hole transporting layer, a hole injection layer, an electron transporting layer, an electron injection layer and a light emitting layer.

The hole transporting layer, the hole injection layer, the electron transporting layer, the electron injection layer and the light emitting layer contain a hole transporting material, a hole injection material, an electron transporting material, an electron injection material and a light emitting material, respectively, and can be formed by using a hole transporting material, a hole injection material, an electron transporting material, an electron injection material and a light emitting material, respectively.

The order, number and thickness of layers to be laminated may be regulated in consideration of the light emission life of an organic EL device to be produced by the production method of the present invention.

The thicknesses of a hole transporting layer, a hole injection layer, an electron transporting layer, an electron injection layer and a light emitting layer are usually 1 nm to 10 µm, respectively.

The organic EL device to be produced by the production method of the present invention preferably has at least one of a hole injection layer and a hole transporting layer between an anode and a light emitting layer, from the standpoint of hole injectability and hole transportability, and preferably has at least one of an electron injection layer and an electron transporting layer between a cathode and a light emitting layer, from the standpoint of electron injectability and electron transportability.

The method of forming a hole transporting layer, a hole injection layer, an electron transporting layer, an electron injection layer and a light emitting layer in the organic EL device to be produced by the production method of the present invention includes, for example, a vacuum vapor deposition method from powder and a method by film formation from solution or melted state when a low molecular weight compound is used, and includes, for example, a method by film formation from solution or melted state when a polymer compound is used.

The hole transporting layer, the hole injection layer, the electron transporting layer, the electron injection layer and the light emitting layer can be formed by an application method by using compositions containing a hole transporting material, a hole injection material, an electron transporting material, an electron injection material and a light emitting layer, respectively. The application method includes, for example, the same methods as the application method in formation of an organic functional layer described above. The organic solvent contained in the composition includes, for example, the same solvents as the organic solvent contained in the composition in formation of an organic functional layer described above.

In the composition, the blending amount of an organic solvent is usually 1000 to 100000 parts by weight, preferably 2000 to 20000 parts by weight with respect to 100 parts by weight of a hole transporting material, a hole injection material, an electron transporting material, an electron injection material and a light emitting material.

When the hole transporting material, the hole injection material, the electron transporting material, the electron injection material and the light emitting material are dissolved in solvents used in forming layers adjacent to a hole transporting layer, a hole injection layer, an electron transporting layer, an electron injection layer and a light emitting layer, respectively, in the production method of the organic EL device of the present invention, it is preferable that the materials have a crosslink group for avoiding dissolution of the materials in the solvents. After forming each layer using a material having a crosslink group, the layer can be insolubilized by crosslinking the crosslink group.

The heating temperature for crosslinking each layer is usually 25 to 300° C., and it is preferably 50 to 250° C., more preferably 150 to 200° C. since the organic EL device to be produced by the production method of the present invention is excellent in light emission life.

The light used in light irradiation for crosslinking each layer includes, for example, ultraviolet light, near ultraviolet light and visible light.

[Substrate/Electrode (Material)]

The organic EL device to be produced by the production method of the present invention usually has a substrate. This substrate may advantageously be a substrate on which an electrode can be formed and which does not chemically change when forming an organic functional layer, and it is, for example, a substrate made of glass, plastic, silicon and the like.

The anode material includes, for example, electrically conductive metal oxides and semi-transparent metals, preferably, indium oxide, zinc oxide, tin oxide; electrically conductive compounds such as indium•tin•oxide (ITO), indium•zinc•oxide and the like; an alloy of Ag, Pd and Cu (APC); NESA, gold, platinum, silver and copper.

The cathode material includes, for example, metals such as lithium, sodium, potassium, rubidium, cesium, beryllium, magnesium, calcium, strontium, barium, aluminum, zinc, indium and the like; alloys composed of two or more of them; alloys composed of one of them and one of silver, copper, manganese, titanium, cobalt, nickel, tungsten and tin; and graphite and graphite intercalation compounds. The alloy includes, for example, a magnesium-silver alloy, a magnesium-indium alloy, a magnesium-aluminum, alloy, an indium-silver alloy, a lithium-aluminum alloy, a lithium-magnesium alloy, a lithium-indium alloy and a calcium-aluminum alloy.

The anode and the cathode each may take a laminated structure composed of two or more layers.

In the organic EL device to be produced by the production method of the present invention, at least one of the anode and the cathode is usually transparent or semi-transparent, and it is preferable that the anode is transparent or semi-transparent.

The method of forming the anode and the cathode includes, for example, a vacuum vapor deposition method, a sputtering method, an ion plating method, a plating method and a laminate method.

[Light Emitting Layer (Light Emitting Material)]

The light emitting material is usually formed mainly of an organic compound (low molecular weight compound and polymer compound) emitting fluorescence or phosphorescence and a dopant aiding this. The light emitting material includes, for example, dye type materials, metal complex type materials and polymer type materials.

The dye type material includes, for example, cyclopentamine and derivatives thereof, tetraphenylbutadiene and derivatives thereof, triphenylamine and derivatives thereof, oxadiazole and derivatives thereof, pyrazoloquinoline and derivatives thereof, distyrylbenzene and derivatives thereof, distyrylarylene and derivatives thereof, pyrrole and derivatives thereof, thiophene ring compounds, pyridine ring compounds, perinone and derivatives thereof, perylene and derivatives thereof, oligothiophene and derivatives thereof, an oxadiazole dimer and a pyrazoline dimer.

The metal complex type material includes, for example, metal complexes having Al, Zn, Be and the like or a rare earth metal such as Tb, Eu, Dy and the like as the central metal and having an oxadiazole, thiadiazole, phenylpyridine, phenylbenzoimidazole or qui no line structure and the like as the ligand, such as an aluminum quinolinol complex, a benzoquinolinol beryllium complex, a benzooxazolyl zinc complex, a benzothiazole zinc complex, an azomethyl zinc complex, a porphyrin zinc complex, a europium complex and the like.

The polymer type material includes, for example, polyparaphenylenevinylene and derivatives thereof, polythiophene and derivatives thereof, polyparaphenylene and derivatives thereof, polysilane and derivatives thereof, polyacetylene and derivatives thereof, polyfluorene and derivatives thereof, polyvinylcarbazole and derivatives thereof, and compounds obtained by increasing the molecular weight of the above-described dye type materials or metal complex type materials.

Of the light emitting materials, blue light emitting materials include, for example, distyrylarylene and derivatives thereof, oxadiazole and derivatives thereof, and polymers thereof; polyvinylcarbazole and derivatives thereof, polyparaphenylene and derivatives thereof and polyfluorene and derivatives thereof, and preferable are polyvinylcarbazole and derivatives thereof, polyparaphenylene and derivatives thereof and polyfluorene and derivatives thereof.

Of the light emitting materials, green light emitting materials include, for example, quinacridone and derivatives thereof, coumarin and derivatives thereof, and polymers thereof; polyparaphenylene and derivatives thereof and polyfluorene and derivatives thereof, and preferable are polyparaphenylene and derivatives thereof and polyfluorene and derivatives thereof.

Of the light emitting materials, red light emitting materials include, for example, coumarin and derivatives thereof, thiophene ring compounds, and polymers thereof; polyparaphenylene and derivatives thereof, polythiophene and derivatives thereof and polyfluorene and derivatives thereof, and preferable are polyparaphenylene and derivatives thereof, polythiophene and derivatives thereof and polyfluorene and derivatives thereof.

A dopant can be added into a light emitting layer for the purpose of an improvement in light emission efficiency, a change of light emission wavelength, and the like. The dopant includes, for example, perylene and derivatives thereof, coumarin and derivatives thereof, rubrene and derivatives thereof, quinacridone and derivatives thereof, squarvlium and derivatives thereof, porphyrin and derivatives thereof, styryl type dyes, tetracene and derivatives thereof, pyrazolone and derivatives thereof, decacyclene and phenoxazone.

The light emitting materials may be used each singly or two or more kinds of the light emitting materials may be used in combination.

[Hole Transporting Layer (Hole Transporting Material)]

The hole transporting material is classified into low molecular weight compounds and polymer compounds, and preferable are polymer compounds. The hole transporting material optionally has a crosslink group.

The polymer compound includes, for example, polyvinylcarbazole and derivatives thereof; and polyarylenes having an aromatic amine structure in the side chain or the main chain and derivatives thereof. The polymer compound may also be a compound in which an electron accepting portion is bonded. The electron accepting portion includes, for example, fullerene, tetrafluorotetracyanoquinodimethane, tetracyanoethylene and trinitrofluorenone, and preferable is fullerene.

The hole transporting materials may be used each singly or two or more kinds of the hole transporting materials may be used in combination.

[Electron Transporting Layer (Electron Transporting Material)]

The electron transporting material is classified into low molecular weight compounds and polymer compounds. The electron transporting material optionally has a crosslink group.

The low molecular weight compound includes, for example, metal complexes having 8-hydroxyquinoline as the ligand, oxadiazole, anthraquinodimethane, benzoquinone, naphthoquinone, anthraquinone, tetracyanoanthraquinodimethane, fluorenone, diphenyldicyanoethylene and diphenoquinone, and derivatives thereof.

The polymer compound includes, for example, polyphenylene, polyfluorene, and derivatives thereof. The polymer compound may be doped with a metal.

The electron transporting materials may be used each singly or two or more kinds of the electron transporting materials may be used in combination.

[Hole Injection Material and Electron Injection Material]

The hole injection material and the electron injection material are each classified into low molecular weight compounds and polymer compounds. The hole injection material and the electron injection material optionally have a crosslink group.

The low molecular weight compound includes, for example, metallic phthalocyanine such as copper phthalocyanine and the like; carbon; oxides of metals such as molybdenum, tungsten and the like; metal fluorides such as lithium fluoride, sodium fluoride, cesium fluoride, potassium fluoride and the like.

The polymer compound includes, for example, electrically conductive polymers such as polyaniline, polythiophene, polypyrrole, polyphenylenevinylene, polythienylenevinylene, polyquinoline and polyquinoxaline, and derivatives thereof; polymers containing an aromatic amine structure in the main chain or the side chain, and the like.

In the composition, the contents of the hole injection material and the electron injection material are each usually 1 to 100 parts by weight, preferably 5 to 100 parts by weight with respect to 100 parts by weight of the hole injection material.

The hole injection materials and the electron injection materials may be used each singly or two or more kinds of the hole injection materials and two or more kinds of the electron injection materials may be used in combination, respectively.

When the hole Injection material or the electron injection material contains an electrically conductive polymer, the electric conductivity of the electrically conductive polymer is preferably $1 \times 10^{-5}$ S/cm to $1 \times 10^3$ S/cm. The electrically conductive polymer can be doped with a suitable amount of ions for adjusting the electric conductivity of the electrically conductive polymer in such a range.

The ion to be doped is an anion in the case of the hole injection material, and is a cation in the case of the electron injection material. The anion includes, for example, a polystyrenesulfonate ion, an alkylbenzenesulfonate ion and a camphor sulfonate ion. The cation includes, for example, a lithium ion, a sodium ion, a potassium ion and a tetrabutyl ammoniumion.

The ions to be doped may be used each singly or two or more kinds of the ions may be used in combination,

[Sealing Layer (Material)]

The sealing layer may advantageously be one showing a barrier property against water and an oxygen gas, and in one embodiment of the sealing layer, an anode, a cathode and at least one organic functional layer of an organic EL device are sealed with a substrate made of glass, plastic, silicon and the like under condition filled with an inert gas such as a nitrogen gas, an argon gas and the like. In another embodiment of the sealing layer, an anode, a cathode and at least one organic functional layer of an organic EL device are sealed with a substrate made of glass, plastic, silicon and the like via an insulation layer made of an organic compound or an insulation layer made of an inorganic compound. The material of the insulation layer made of an organic compound includes, for example, thermoplastic resins and photocrosslinkable resins. The material of the insulation layer made of an inorganic compound includes, for example, metal oxides and metal nitrides.

A desiccant may be disposed on the sealing layer or a desiccant may be contained inside the sealing layer.

The sealing layer is usually formed at the end, after forming an anode, a cathode and at least one organic functional layer.

<Application of Organic EL Device>

For obtaining planar light emission using an organic EL device, a planar anode and a planar cathode may advantageously be disposed so as to overlap. For obtaining patterned light emission, a method of disposing a mask having a patterned window on the surface of a planar organic EL device, a method of forming a layer intending a no-emission portion extremely thick thereby attaining substantially no-emission, and a method of forming an anode or a cathode, or both electrodes, in the form of pattern, are listed. By forming a pattern by any of these methods and by disposing some electrodes so that independent ON/OFF is possible, a segment type display capable of displaying numerals, letters and the like is obtained. For obtaining a dot matrix display, it is advantageous that both an anode and a cathode are formed in the form of stripe and disposed so as to be orthogonalized. Partial color display and multi-color display become possible by a method of separately painting several kinds of polymer compounds of different emission colors and a method of using a color filter or a fluorescence conversion filter. A dot matrix display can be driven passively, or can be driven actively in combination with TFT and the like. These display devices can be used as a display of computers, television sets, mobile terminals and the like. The planar organic EL device can be suitably used as a planar light source for backlight of liquid crystal displays or as a planar illumination light source. When a flexible substrate is used, it can be used also as a curved light source and a curved display.

EXAMPLES

The present invention will be illustrated in detail by examples below, but the present invention is not limited to these examples.

Example 1

The following steps were conducted in a space prepared using CHEMICAL GUARD (manufactured by NICHIAS Corporation, model number: WAVE-HA).

(Formation of Anode and Hole Injection Layer)

An ITO film was attached with a thickness of 45 nm to a glass substrate by a sputtering method, to form an anode. This substrate was washed with an organic solvent, an alkali detergent and ultrapure water, and dried for about 4 hours with a hot air of about 80° C. Next, an UV-$O_3$ treatment was conducted for about 15 minutes using an UV-$O_3$ apparatus on the surface on which the ITO film had been formed. A composition containing a hole injection material was dropped onto the ITO film, and treated for 28 seconds by a spin coat method, to form a film with a thickness of 35 nm. The film was dried on a hot plate at 80° C. for 4 minutes, followed by a hold time of 35 minutes, and further heated at 230° C. for 15 minutes, then, cooled for 10 minutes, to form, a hole injection layer.

The cumulative exposure level by which the organic EL device during production was exposed to a nitrogen oxide in the step of forming the hole injection layer was $2.4 \times 10^{-5} \times 3868 = 0.0939$ ppm·sec. The cumulative exposure level excluding a time required for the film formation stage of 28 seconds was $2.4 \times 10^{-5} \times 3840 = 0.0933$ ppm·sec.

(Formation of Hole Transporting Layer)

A hole transporting material was mixed with xylene, to obtain a hole transporting layer forming composition having a solid concentration (hole transporting material) of 0.6% by weight. The hole transporting layer forming composition dropped on the hole injection layer was treated for 13 seconds by a spin coat method, to form a film with a thickness of 20 nm. After a hold time of 8 minutes, the film was calcined under a nitrogen gas atmosphere at 180° C. for 60 minutes, then, naturally cooled down to room temperature, to form a hole transporting layer.

The cumulative exposure level by which the organic EL device during production was exposed to a nitrogen oxide in the step of forming the hole transporting layer was $2.4 \times 10^{-5} \times 493 = 0.0120$ ppm·sec. The cumulative exposure level excluding a time required for the firm formation stage of 13 seconds was $2.4 \times 10^{-5} \times 480 = 0.0117$ ppm·sec.

(Formation of Light Emitting Layer)

A luminescent conjugated polymer compound was mixed with xylene, to obtain a light emitting layer forming composition having a solid concentration (luminescent conjugated polymer compound) of 1.3% by weight. The light emitting layer forming composition dropped on the hole transporting layer was treated for 34 seconds by a spin coat method, to form a film with a thickness of 60 nm. Thereafter, the film was held for 30 minutes.

The cumulative exposure level by which the organic EL device during production was exposed to a nitrogen oxide in a process by this time was $2.4 \times 10^{-5} \times 1834 = 0.0445$ ppm·sec. The cumulative exposure level excluding a time required for the film formation stage of 34 seconds was $2.4 \times 10^{-5} \times 1800 = 0.0437$ ppm·sec.

Thereafter, the device was exposed to a nitrogen oxide so that the cumulative exposure level by which the organic EL device during production was exposed to a nitrogen oxide under a sealed atmosphere having a controlled nitrogen oxide concentration was 1.044 ppm·sec. At this time, the average concentration of the nitrogen oxide was 0.116 ppm, and the exposure time was 9 seconds. Thereafter, the device was calcined under a nitrogen gas atmosphere at 150° C. for 10 minutes, then, naturally cooled down to room temperature under a nitrogen gas atmosphere, to form a light emitting layer. At this time, the cumulative exposure level by which the organic EL device during production was exposed to a nitrogen oxide in the step of forming the light emitting layer was 1.0885 ppm·sec. The cumulative exposure level excluding a time of the film formation step of 34 seconds was 1.0877 ppm·sec.

(Formation of Cathode)

The organic EL device during production carrying the light emitting layer formed was placed in a vapor deposition apparatus, and the pressure in the apparatus was reduced to $1.0 \times 10^{-4}$ Pa or less, then, as a cathode, sodium fluoride was vapor-deposited with a thickness of about 3 nm on the light emitting layer, then, aluminum was vapor-deposited with a thickness of about 100 nm thereon. Thereafter, a sealing layer was formed using a glass substrate under a nitrogen gas atmosphere, to fabricate an organic EL device 1. The time required for formation of the cathode and sealing was 4500 seconds.

As described above, the cumulative exposure level A×B by which the organic EL device during production was exposed to a nitrogen oxide from initiation time of the step of forming the organic functional layer until termination time of the step of forming the sealing layer, during production of the organic EL device 1, was 1.1945 ppm·sec. The average concentration A of the nitrogen oxide was 0.00019 ppm, and the exposure time B was 6204 seconds.

The cumulative exposure level A×(B−C) excluding the time required for the film formation stage of the organic functional layer was 1.1926 ppm·sec. The average concentration A of the nitrogen oxide was 0.00019 ppm, and the exposure time B−C was 6129 seconds.

When voltage was applied to the organic EL device 1, blue EL emission was observed. The current value was set so that the initial luminance was 8000 cd/m$^2$, then, the device was driven at constant current, and the life during which the initial luminance lowers by half (hereinafter, referred to as "LT50") was measured, to find a value of 122 hours.

Example 2

An organic EL device was fabricated in the same manner as in Example 1, excepting that the organic EL device during production carrying the light emitting layer formed thereon was exposed to a nitrogen oxide so that the cumulative exposure level by which the device was exposed to a nitrogen oxide in an atmosphere having a controlled nitrogen oxide concentration was 3.016 ppm·sec, in Example 1 (hereinafter, referred to as "organic EL device 2"). The average concentration of the nitrogen oxide was 0.116 ppm, and the exposure time was 26 seconds.

As described above, the cumulative exposure level A×B by which the organic EL device during production was exposed to the nitrogen oxide from initiation time of the step of forming the organic functional layer until termination time of the step of forming the sealing layer, during production of the organic EL device 2, was 3.1665 ppm·sec. The average concentration A of the nitrogen oxide was 0.00051 ppm, and the exposure time B was 6221 seconds.

The cumulative exposure level A×(B−C) excluding the time required for the film formation stage of the organic functional layer was 3.1646 ppm·sec. The average concentration A of the nitrogen oxide was 0.00051 ppm, and the exposure time B−C was 6146 seconds.

When voltage was applied to the organic EL device 2, blue EL emission was observed. The current value was set so that the initial luminance was 8000 cd/m$^2$, then, the device was driven at constant current, and LT50 was measured, to find a value of 121 hours.

Example 3

An organic EL device was fabricated in the same manner as in Example 1, excepting that the organic EL device during production carrying the light emitting layer formed thereon was exposed to a nitrogen oxide so that the cumulative exposure level by which the device was exposed to a nitrogen oxide in an atmosphere having a controlled nitrogen oxide concentration was 4.988 ppm·sec, in Example 1 (hereinafter, referred to as "organic EL device 3"). The average concentration of the nitrogen oxide was 0.116 ppm, and the exposure time was 43 seconds.

As described above, the cumulative exposure level A×B by which the organic EL device during production was exposed to the nitrogen oxide from initiation time of the step of forming the organic functional layer until termination time of the step of forming the sealing layer, during production of the organic EL device 3, was 5.1385 ppm·sec. The average concentration A of the nitrogen oxide was 0.00082 ppm, and the exposure time B was 6238 seconds.

The cumulative exposure level A×(B−C) excluding the time required for the film formation stage of the organic functional layer was 5.1366 ppm·sec. The average concentration A of the nitrogen oxide was 0.00083 ppm, and the exposure time B−C was 6163 seconds.

When voltage was applied to the organic EL device 3, blue EL emission was observed. The current value was set so that the initial luminance was 8000 cd/m$^2$, then, the device was driven at constant current, and LT50 was measured, to find a value of 121 hours.

Example 4

An organic EL device was fabricated in the same manner as in Example 1, excepting that the organic EL device during production carrying the light emitting layer formed thereon was exposed to a nitrogen oxide so that the cumulative exposure level by which the device was exposed to a nitrogen oxide in an atmosphere having a controlled nitrogen oxide concentration was 10.092 ppm·sec, in Example 1 (hereinafter, referred to as "organic EL device 4"). The average concentration of the nitrogen oxide was 0.116 ppm, and the exposure time was 87 seconds.

As described above, the cumulative exposure level A×B by which the organic EL device during production was exposed to the nitrogen oxide from initiation time of the step of forming the organic functional layer until termination time of the step of forming the sealing layer, during production of the organic EL device 4, was 10.2425 ppm·sec. The average concentration A of the nitrogen oxide was 0.00163 ppm, and the exposure time B was 6282 seconds.

The cumulative exposure level A×(B−C) excluding the time required for the film formation stage of the organic functional layer was 10.2406 ppm·sec. The average concentration A of the nitrogen oxide was 0.00165 ppm, and the exposure time B−C was 6207 seconds.

When voltage was applied to the organic EL device 4, blue EL emission was observed. The current value was set so that the initial luminance was 8000 cd/m$^2$, then, the device was driven at constant current, and LT50 was measured, to find a value of 121 hours.

Comparative Example 1

An organic EL device was fabricated in the same manner as in Example 1, excepting that the organic EL device during production carrying the light emitting layer formed thereon was exposed to a nitrogen oxide so that the cumulative exposure level by which the device was exposed to a nitrogen oxide in an atmosphere having a controlled nitrogen oxide concentration was 20.068 ppm·sec, in Example 1 (hereinafter, referred to as "organic: EL device C1"). The average concentration of the nitrogen oxide was 0.116 ppm, and the exposure time was 173 seconds.

As described above, the cumulative exposure level A×B by which the organic EL device during production was exposed to the nitrogen oxide from initiation time of the step of forming the organic functional layer until termination time of the step of forming the sealing layer, during production of the organic EL device C1, was 20.2185 ppm·sec. The average concentration A of the nitrogen oxide was 0.00318 ppm, and the exposure time B was 6368 seconds.

The cumulative exposure level A×(B−C) excluding the time required for the film formation stage of the organic functional layer was 20.2166 ppm·sec. The average concentration A of the nitrogen oxide was 0.00321 ppm, and the exposure time B−C was 6293 seconds.

When voltage was applied to the organic EL device C1, blue EL emission was observed. The current value was set so that the initial luminance was 8000 cd/m$^2$, then, the device was driven at constant current, and LT50 was measured, to find a value of 116 hours.

Comparative Example 2

An organic EL device was fabricated in the same manner as in Example 1, excepting that the organic EL device during production carrying the light emitting layer formed thereon was exposed to a nitrogen oxide so that the cumulative exposure level by which the device was exposed to a nitrogen oxide in an atmosphere having a controlled nitrogen oxide concentration was 50.228 ppm·sec, in Example 1 (hereinafter, referred to as "organic EL device C2"). The average concentration of the nitrogen oxide was 0.116 ppm, and the exposure time was 433 seconds.

As described above, the cumulative exposure level A×B by which the organic EL device during production was exposed to the nitrogen oxide from initiation time of the step of forming the organic functional layer until termination time of the step of forming the sealing layer, during production of the organic EL device C2, was 50.3785 ppm·sec. The average concentration A of the nitrogen oxide was 0.00760 ppm, and the exposure time B was 6628 seconds.

The cumulative exposure level A×(B−C) excluding the time required for the film formation stage of the organic functional layer was 50.3766 ppm·sec. The average concentration A of the nitrogen oxide was 0.00769 ppm, and the exposure time B was 6553 seconds.

When voltage was applied to the organic EL device C2, blue EL emission was observed. The current value was set so that the initial luminance was 8000 cd/m$^2$, then, the device was driven at constant current, and LT50 was measured, to find a value of 109 hours.

TABLE 1

| organic EL device | A × B (ppm · sec) | A × (B − C) (ppm · sec) | LT50 (hr) |
|---|---|---|---|
| Example 1 | 1 | 1.1945 | 1.1926 | 122 |
| Example 2 | 2 | 3.1665 | 3.1646 | 121 |
| Example 3 | 3 | 5.1385 | 5.1366 | 121 |
| Example 4 | 4 | 10.2425 | 10.2406 | 121 |

TABLE 1-continued

| organic EL device | A × B (ppm · sec) | A × (B − C) (ppm · sec) | LT50 (hr) |
|---|---|---|---|
| Comparative Example 1 | C1 | 20.2185 | 20.2166 | 116 |
| Comparative Example 2 | C2 | 50.3785 | 50.3766 | 109 |

The invention claimed is:

1. A method for producing an organic EL device having an anode, a cathode, at least one organic functional layer disposed between the anode and the cathode, and a sealing layer, comprising
a step of forming the anode, a step of forming the cathode, a step of forming the at least one organic functional layer and a step of forming the sealing layer,
wherein the average concentration: A (ppm) of a nitrogen oxide to which the organic EL device during production is exposed from initiation time of the step of forming the at least one organic functional layer until termination time of the step of forming the sealing layer and the exposure time thereof: B (sec) satisfy the formula (1-1):

$$1 \leq A \times B < 12 \qquad (1\text{-}1).$$

2. The method for producing an organic EL device according to claim 1, wherein the step of forming the at least one organic functional layer contains a film formation stage, a drying stage and a calcination stage, and the time necessary for the film formation stage: C (sec) satisfies the formula (2-1):

$$0 \leq A \times (B-C) < 12 \qquad (2\text{-}1).$$

3. The method for producing an organic EL device according to claim 1, wherein A satisfies the formula (3-1):

$$0 \leq A < 1 \qquad (3\text{-}1).$$

4. The method for producing an organic EL device according to claim 1, wherein B satisfies the formula (4-1):

$$0 \leq B \leq 86400 \qquad (4\text{-}1).$$

5. The production method of an organic EL device according to claim 2, wherein C satisfies the formula (5-1):

$$0 \leq C \leq 3000 \qquad (5\text{-}1).$$

6. The method for producing an organic EL device according to claim 1, wherein the average concentration: D (ppm) of a nitrogen oxide, the average concentration: E (ppm) of a sulfur oxide and the average concentration: F (ppm) of ammonia, to which the organic EL device during production is exposed from initiation time of the step of forming the at least one organic functional layer until termination time of the step of forming the sealing layer, and the exposure time thereof: G (sec), satisfy at least two of the formulae (6-1) to (6-3):

$$0 \leq D \times G < 12 \qquad (6\text{-}1)$$

$$0 \leq E \times G < 2.2 \qquad (6\text{-}2)$$

$$0 \leq F \times G < 105 \qquad (6\text{-}3).$$

7. The method for producing an organic EL device according to claim 6, wherein D, E and F satisfy at least two of the formulae (9-1) to (9-3):

$$0 \leq D < 1 \qquad (9\text{-}1)$$

$$0 \leq E < 0.3 \qquad (9\text{-}2)$$

$$0 \leq F < 1 \qquad (9\text{-}3).$$

8. The method for producing an organic EL device according to claim 6, wherein G satisfies the formula (12-1):

$$0 \leq G \leq 86400 \tag{12-1}.$$

9. The method for producing an organic EL device according to claim 1, wherein the step of forming the at least one organic functional layer contains a step of film formation by an application method using a composition containing an organic functional material and an organic solvent.

10. The method for producing an organic EL device according to claim 1, wherein the at least one organic functional layer contains a polymer compound.

* * * * *